(12) United States Patent
Nakagawa

(10) Patent No.: US 6,369,724 B1
(45) Date of Patent: Apr. 9, 2002

(54) MODULATING APPARATUS AND METHOD, DEMODULATING APPARATUS AND METHOD, AND TRANSMISSION MEDIUM

(75) Inventor: Toshiyuki Nakagawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/187,835

(22) Filed: Nov. 6, 1998

(30) Foreign Application Priority Data

Nov. 7, 1997 (JP) ............................................. 9-305516

(51) Int. Cl.[7] ........................ H03M 13/00; H03M 7/00; H03M 7/40
(52) U.S. Cl. ............................. 341/59; 341/67; 714/779
(58) Field of Search ............................. 341/59, 67, 94; 714/779

(56) References Cited

U.S. PATENT DOCUMENTS

| | | | | |
|---|---|---|---|---|
| 4,146,909 A | * | 3/1979 | Beckenhauer et al. | 360/39 |
| 4,463,344 A | * | 7/1984 | Adler et al. | 341/51 |
| 4,488,142 A | * | 12/1984 | Franaszek | 341/59 |
| 4,488,143 A | * | 12/1984 | Martin | 341/59 |
| 4,691,193 A | * | 9/1987 | Khu | 341/67 |
| 5,969,649 A | * | 10/1999 | Ashley et al. | 341/59 |
| 6,127,951 A | * | 10/2000 | Nakagawa et al. | 341/59 |

\* cited by examiner

*Primary Examiner*—Albert Decady
*Assistant Examiner*—Joseph D. Torres
(74) *Attorney, Agent, or Firm*—Frommer Lawrence & Haug LLP; William S. Frommer; Gordon Kessler

(57) ABSTRACT

A channel bit sequence converting unit detects the particular code sequence in which the minimum run is repeated from the code rule output from the run detection processing unit and converts the particular code sequence, when it is detected, to the predetermined channel bit sequence and then outputs this channel bit sequence to a buffer. Thereby, modulation and demodulation of the code having the code restriction can be performed easily.

15 Claims, 5 Drawing Sheets

MODULATING APPARATUS AND METHOD, DEMODULATING APPARATUS AND METHOD, AND TRANSMISSION MEDIUM

BACKGROUND OF THE INVENTION

1. Field of the Invention

The present invention relates to a modulating apparatus and method, demodulating apparatus and method, and a transmission medium and in particular to a modulating apparatus and method, demodulating apparatus and method, and a transmission medium which are suitable for modulating data for data transmission or recording on a recording medium, and demodulating the modulated code obtained by this modulation so as to reproduce the data.

2. Description of the Related Art

This block coding converts a data sequence to blocks of m×i bit units (referred to hereafter as data words), and this data word is converted to a code word comprising n×i bits according to a suitable code rule. When i=1, this code word is a fixed length code. A plurality of values for i can be selected. Thus, a predetermined i may be selected from the range of 1 to imax (maximum of i). The selected value is indicative of a variable length code. This block encoded code is represented by a variable length code (d, k; m, n; r).

Here, i is known as a restriction length, and imax is r (the maximum restriction length). The minimum run d shows the minimum number of consecutive "0"s in repeated "1"s in a code sequence. The maximum run k shows the maximum number of consecutive "0"s in repeated "1"s in a code sequence.

In compact discs or mini-discs (trademark) etc., NRZI (Non Return to Zero Inverted) modulation, wherein "1" means inversion and "0" means non-inversion, is performed on the variable length code obtained above. The NRZI modulated variable length code (hereafter, referred to as a recorded waveform sequence) is then recorded.

Various modulation techniques have been proposed. If the minimum inversion interval of the recorded waveform sequence is Tmin, and the maximum inversion interval is Tmax, to record at a high density in a linear velocity direction, the minimum inversion interval Tmin should be long, that is, the minimum run d should be large. From the clock reproduction aspect, moreover, the maximum inversion interval Tmax should be short, that is, the maximum run k should be small.

For example, one modulation technique used by magnetic disks or magneto-optical disks, etc., is RLL(1-7) code. The parameters of this modulating technique are (1, 7; 2, 3; 2). The minimum inversion interval Tmin is 2(=1+1)T(=(2/3)×2 Tdata=1.33 Tdata). The maximum inversion interval Tmax is 8(=7+1) (=(2/3)×8 Tdata=5.33 Tdata). In addition, a detection window width Tw is 0.67(=2/3) Tdata. For example, the variable length conversion table for the RLL (1-7) code is as follow.

TABLE 1

RLL (1, 7; 2, 3; 2)

|  | Data | Code |
|---|---|---|
| i = 1 | 1 1 | 0 0 x |
|  | 1 0 | 0 1 0 |
|  | 0 1 | 1 0 x |
| i = 2 | 0 0 1 1 | 0 0 0   0 0 x |
|  | 0 0 1 0 | 0 0 0   0 1 0 |

TABLE 1-continued

RLL (1, 7; 2, 3; 2)

| Data | Code |
|---|---|
| 0 0 0 1 | 1 0 0   0 0 x |
| 0 0 0 0 | 1 0 0   0 1 0 |

The symbol x in the conversion table is 1 when the next channel bit is 0, and 0 when the next channel bit is 1 (this is also true in the following explanation).

The table 2 is a demodulation table of Table 1 of the RLL (1-7) code.

TABLE 2

DEM-RLL (1, 7; 2, 3; 2)

|  | Code sequence | Demodulated data sequence |
|---|---|---|
| i = 1 | 0 0 1 | 1 1 |
|  | 0 0 0 1 | 1 1 |
|  | 0 1 0 | 1 0 |
|  | 1 0 1 | 0 1 |
|  | 1 0 0 1 | 0 1 |
| i = 2 | 0 0 0   0 0 - | 0 0 1 1 |
|  | 0 0 0   0 1 - | 0 0 1 0 |
|  | 1 0 0   0 0 1 | 0 0 0 1 |
|  | 1 0 0   0 0 0 1 | 0 0 0 1 |
|  | 1 0 0   0 1 - | 0 0 0 0 |

In this table, a hyphen (-) means a desired bit (1 or 0, as desired)(this is also true in the following explanation)

In the Table 2, the third code sequence "100 001" and the fourth code sequence "100 0001" of i=2 are combined to obtain "100 00-" for the demodulation. However, in this case, worst error propagation during the bit shift error is 6 bits and the worst error propagation during the bit shift error is 5 bits according to Table 2.

However, the RLL(1-7) code can also be produced from the fixed length code. Parameters of the fixed length RLL (107) code is (1, 7; 2, 3; 1) and the minimum inversion interval Tmin becomes 2(=1+1)T when the bit interval of the recording waveform sequence is T. Thereby, the minimum inversion interval Tmin becomes 1.33 (=(2/3)×2) Tdata when the bit interval of data sequence is assumed as Tdata. Moreover, the maximum inversion interval Tmax is 8T(5.33Tdata). In addition, the detection window width Tw is expressed by (m/n)×T and its value is 0.67 (=2/3)T. Table 3 shows the table of the fixed length RLL (1-7) code. This table is the ISO standard table. An example of the demodulation table of Table 3 is shown in Table 4.

TABLE 3

F-RLL (1, 7; 2, 3; 1)

| Immediately preceding code word | Current data word | Next data word | Converted code word |
|---|---|---|---|
| x | 0 0 | 0 x | 0 0 1 |
| 0 | 0 0 | 1 x | 0 0 0 |
| 1 | 0 0 | 1 x | 0 1 0 |
| 0 | 0 1 | 0 x | 0 0 1 |
| 0 | 0 1 | 1 x | 0 0 0 |
| 1 | 0 1 | 0 0 | 0 1 0 |
| 1 | 0 1 | not 0 0 | 0 0 0 |

TABLE 3-continued

F-RLL (1, 7; 2, 3; 1)

| Immediately preceding code word | Current data word | Next data word | Converted code word |
|---|---|---|---|
| 0 | 1 0 | 0 x | 1 0 1 |
| 0 | 1 0 | 1 x | 0 1 0 |
| 0 | 1 1 | 0 0 | 0 1 0 |
| 0 | 1 1 | not 0 0 | 1 0 0 |

TABLE 4

DEM-F-RLL (1, 7; 2, 3; 1)

| Immediately preceding code word | Current code word | Next code word | Converted data word |
|---|---|---|---|
| x 1 0 | 0 0 0 | x x x | 0 0 |
| not x 1 0 | 0 0 0 | x x x | 0 1 |
| x 0 O | 0 0 1 | x x x | 0 1 |
| not x 0 0 | 0 0 1 | x x x | 0 0 |
| x x 0 | 0 1 0 | 0 0 x | 1 1 |
| x x 0 | 0 1 0 | not 0 0 x | 1 0 |
| x x 1 | 0 1 0 | 0 0 x | 0 1 |
| x x 1 | 0 1 0 | not 0 0 x | 0 0 |
| x x x | 1 0 0 | x x x | 1 1 |
| x x x | 1 0 1 | x x x | 1 0 |

In this table not x00 means any code word of x11, x10, x01, while not x10 means any code word of x11, x01, x00 and not 00x means any code word of 1x, 10x, 01x (this is also true in the following explanation).

This RLL(1-7) code enables replacement of the data words to be converted as shown in Table 5. In this case, the demodulation can be realized on the 1:1 basis as in the case of the Table 3. An example of the demodulation table of table 5 is shown in Table 6.

TABLE 5

F-RLL (1, 7; 2, 3; 1)

| Immediately preceding code word | Current data word | Next data word | Converted code word |
|---|---|---|---|
| 0 | 0 0 | 1 1 | 0 1 0 |
| 0 | 0 0 | not 1 1 | 1 0 0 |
| 0 | 0 1 | 0 x | 0 1 0 |
| 0 | 0 1 | 1 x | 1 0 1 |
| 0 | 1 0 | 0 x | 0 0 0 |
| 0 | 1 0 | 1 x | 0 0 1 |
| 1 | 1 0 | 1 1 | 0 1 0 |
| 1 | 1 0 | not 1 1 | 0 0 0 |
| 0 | 1 1 | 0 x | 0 0 0 |
| 1 | 1 1 | 0 x | 0 1 0 |
| x | 1 1 | 1 x | 0 0 1 |

In this table, not11 means any data word of 00, 01, 10 (this is also true in the following explanation).

TABLE 6

DEM-F-RLL (1, 7; 2, 3; 1)

| Immediately preceding code word | Current code word | Next code word | Converted data word |
|---|---|---|---|
| x 1 0 | 0 0 0 | x x x | 1 1 |
| not x 1 0 | 0 0 0 | x x x | 1 0 |
| x 0 0 | 0 0 1 | x x x | 1 0 |
| not x 0 0 | 0 0 1 | x x x | 1 1 |
| x x 1 | 0 1 0 | 0 0 x | 1 0 |
| x x 1 | 0 1 0 | not 0 0 x | 1 1 |
| x x 0 | 0 1 0 | 0 0 x | 0 0 |
| x x 0 | 0 1 0 | not 0 0 x | 0 1 |
| x x x | 1 0 0 | x x x | 0 0 |
| x x x | 1 0 1 | x x x | 0 1 |

When the code limiting the repetition of the minimum run is given to the above variable length RLL (1-7) code as indicated below. Here, the table adding the code to control the minimum run sequence is called the RML (Repeated Minimum run-length Limited Code). The RML (1-7) code shown in Table 7 is generated for the Table 1. An example of the conversion table of Table 7 is shown in Table 8.

TABLE 7

RML (1, 7; 2, 3; 3)

| | Data | Code |
|---|---|---|
| i = 1 | 1 1 | 0 0 x |
| | 1 0 | 0 1 0 |
| | 0 1 | 1 0 x |
| i = 2 | 0 0 1 1 | 0 0 0 0 0 x |
| | 0 0 1 0 | 0 0 0 0 1 0 |
| | 0 0 0 1 | 1 0 0 0 0 x |
| | 0 0 0 0 | 1 0 0 0 1 0 |
| i = 3 | 1 0 0 1 1 0 | 1 0 0 0 0 0 0 1 0 |

"x" in the table 7 is determined by a complementary number of the sequential code bits. In this case, the minimum run is repeated up to five times.

TABLE 8

DEM-RML (1, 7; 2, 3; 3)

| | Code sequence | Demodulated data sequence |
|---|---|---|
| i = 1 | 0 0 1 | 1 1 |
| | 0 0 0 1 | 1 1 |
| | 0 1 0 | 1 0 |
| | 1 0 1 | 0 1 |
| | 1 0 0 1 | 0 1 |
| i = 2 | 0 0 0   0 0 - | 0 0 1 1 |
| | 0 0 0   0 1 - | 0 0 1 0 |
| | 1 0 0   0 0 1 | 0 0 0 1 |
| | 1 0 0   0 0 0 1 | 0 0 0 1 |
| | 1 0 0   0 1 - | 0 0 0 0 |
| i = 3 | 1 0 0   0 0 0   0 1 - | 1 0 0 1 1 |

Similarly, when the code limiting the repetition of the minimum run can be added as follow to the fixed length RLL (1-7) code. The RML (1-7) code of Table 9 is generated to Table 3 and the RML (1-7) code of Table 11 is generated to Table 5. An example of the conversion table of Table 9 becomes as Table 10, while the conversion table of Table 11 becomes as Table 12. Moreover, the maximum restriction length in Table 10 and Table 12 is 1 or 3.

TABLE 9

F-RML (1, 7; 2, 3; -)

| Immediately preceding code word | Current data word | Next data word | Converted code word |
|---|---|---|---|
| x | 0 0 | 0 x | 0 0 1 |
| 0 | 0 0 | 1 x | 0 0 0 |
| 1 | 0 0 | 1 x | 0 1 0 |
| 0 | 0 1 | 0 x | 0 0 1 |
| 0 | 0 1 | 1 x | 0 0 0 |
| 1 | 0 1 | 0 0 | 0 1 0 |
| 1 | 0 1 | not 0 0 | 0 0 0 |
| 0 | 1 0 | 0 x | 1 0 1 |
| 0 | 1 0 | 1 x | 0 1 0 |
| 0 | 1 1 | 0 0 | 0 1 0 |
| 0 | 1 1 | not 0 0 | 1 0 0 |
| 0 | 1 0 | 00-10-0x | 100-000-001 |

TABLE 10

DEM-F-RLL (1, 7; 2, 3; 1<3>)

| Immediately preceding code word | Current code word | Next code word | Demodulated data word |
|---|---|---|---|
| x 1 0 | 0 0 0 | x x x | 0 0 |
| not x 1 0 | 0 0 0 | x x x | 0 1 |
| x 0 0 | 0 0 1 | x x x | 0 1 |
| not x 0 0 | 0 0 1 | x x x | 0 0 |
| x x 0 | 0 1 0 | 0 0 x | 1 1 |
| x x 0 | 0 1 0 | not 0 0 x | 1 0 |
| x x 1 | 0 1 0 | 0 0 x | 0 1 |
| x x 1 | 0 1 0 | not 0 0 x | 0 0 |
| x x x | 1 0 0 | x x x | 1 1 |
| x x x | 1 0 1 | x x x | 1 0 |
| x x x | 1 0 0 | 000-001 | 10-00-10 |

TABLE 11

F-RML (1, 7; 2, 3; —)

| Immediately preceding code word | Current data word | Next data word | Converted code word |
|---|---|---|---|
| 0 | 0 0 | 1 1 | 0 1 0 |
| 0 | 0 0 | not 1 1 | 1 0 0 |
| 0 | 0 1 | 0 x | 0 1 0 |
| 0 | 0 1 | 1 x | 1 0 1 |
| 0 | 1 0 | 0 x | 0 0 0 |
| 0 | 1 0 | 1 x | 0 0 1 |
| 1 | 1 0 | 1 1 | 0 1 0 |
| 1 | 1 0 | not 1 1 | 0 0 0 |
| 0 | 1 1 | 0 x | 0 0 0 |
| 1 | 1 1 | 0 x | 0 1 0 |
| x | 1 1 | 1 x | 0 0 1 |
| 0 | 0 1 | 11-01-1x | 100-000-001 |

TABLE 12

DEM-F-RML (1, 7; 2, 3; 1<3>)

| Immediately preceding code word | Current code word | Next code word | Demodulated data word |
|---|---|---|---|
| x 1 0 | 0 0 0 | x x x | 1 1 |
| not x10 | 0 0 0 | x x x | 1 0 |
| x 0 0 | 0 0 1 | x x x | 1 0 |
| not x00 | 0 0 1 | x x x | 1 1 |
| x x 1 | 0 1 0 | 0 0 x | 1 0 |
| x x 1 | 0 1 0 | not 00x | 1 1 |
| x x 0 | 0 1 0 | 0 0 x | 0 0 |
| x x 0 | 0 1 0 | not 00x | 0 1 |
| x x x | 1 0 0 | x x x | 00 |
| x x x | 1 0 1 | x x x | 0 1 |
| x x x | 1 0 0 | 000-001 | 01-11-01 |

As explained above, conversion to the code sequence which is restricted appropriately in the repetition of minimum run at the time of modulation can be performed by adding the conversion rule in the table.

However, when the RML code is used in the modulating apparatus utilizing the RLL code, here rises a problem that design of a new apparatus is necessary because there is the code to be added, although the format of the table is the same in the greater part and the circuit configuration is also complicated.

SUMMARY OF THE INVENTION

Considering the background explained above, the present invention has been proposed to make unnecessary the design of a new apparatus with a simplified circuit structure by using the code conversion table of the related art in the code conversion table having the additional code to convert the particular code sequence and then converting the particular code sequence.

A modulating apparatus according to the invention is characterized by providing a converting means for converting a code sequence in which the minimum run d after the run-length limited code conversion is repeated for the predetermined number of times to the predetermined code sequence.

A converting method according to the invention characterized by providing a converting step for converting a code sequence in which the minimum run d after the run-length limited code conversion is repeated for the predetermined number of times to the predetermined code sequence.

A transmission medium according to the invention is characterized by transmitting a computer program comprising a conversion step for converting a code sequence in which the minimum run d after the run-length limited code conversion is repeated for the predetermined number of times to the predetermined code sequence.

A converting apparatus according to the invention is characterized by providing a converting means for converting the code sequence in which the maximum run k after the run-length limited code conversion becomes infinite to the code sequence in which the maximum run k becomes finite.

A converting method according to the invention is also characterized by providing a converting step for converting means for converting the code sequence in which the maximum run k after the run-length limited code conversion becomes infinite to the code sequence in which the maximum run k becomes finite.

A transmission medium according to the invention is also characterized by transmitting a computer program providing a conversion step for converting a code sequence in which the maximum run k after the run-length limited code conversion becomes infinite to the code sequence in which the maximum run k becomes finite.

A demodulating apparatus according to the invention is characterized by providing a converting means for converting a code sequence replaced when the minimum run d is repeated to the predetermined code sequence from the run-length limited code sequence.

A demodulating method according to the invention is characterized by providing a converting step for converging a code sequence replaced when the minimum run d is repeated to the predetermined code sequence from the run-length limited code sequence.

A transmission medium according to the invention is characterized by transmitting a computer program comprising a converting step for converging a code sequence replaced when the minimum run d is repeated to the predetermined code sequence from the run-length limited code sequence.

A demodulating apparatus according to the invention is characterized by providing a converting means for converting a code sequence replaced when the maximum run k is infinite to the predetermined code sequence from the run-length limited code sequence.

A demodulating method according to the invention is characterized by providing a converting step for converting a code sequence replaced when the maximum run k is infinite to the predetermined code sequence from the run-length limited code sequence.

A transmission medium according to the invention is also characterized by transmitting a computer program providing a converting step for converting a code sequence replaced when the maximum run k is infinite to the predetermined code sequence from the run-length limited code sequence.

In the modulating apparatus according to the invention, a code sequence is provided in which the minimum run d is repeated after the run-length limited code conversion is converted to the predetermined code sequence.

In the modulating apparatus according to the invention, a code sequence is provided in which the maximum run k becomes infinite after the run-length limited code conversion is converted to the code sequence in which the maximum run k becomes finite.

In the demodulating apparatus according to the invention, a code sequence is replaced when the minimum run d is repeated is converted to the predetermined code sequence from the run-length limited code sequence.

In the demodulating apparatus according to the invention, a code sequence is replaced when the maximum run k is infinite is converted to the predetermined code sequence from the run-length limited code sequence.

DESCRIPTION OF THE PREFERRED EMBODIMENTS

The preferred embodiments of the present invention will be explained below. In order to make clear the correspondence between each means of the inventions described in each claim and the following embodiments, the characteristics of the present invention will be described by adding only an example of the corresponding embodiment within the parentheses after each means. However, the description does not mean limitation of each means. In addition, for the table corresponding to the related art, the same table is used and the same explanation is not repeated here.

The modulating apparatus of the invention is characterized by providing a converting means (for example, a channel bit sequence converting unit 16 of FIG. 1) for converting a code sequence in which the minimum run d after the run-length limited code conversion is repeated to the predetermined code sequence.

The converting apparatus of the invention is characterized by providing a converting means (for example, a channel bit sequence converting unit 96 of FIG. 5) for converting a code sequence in which t he maximum run k after the run-length limited code conversion becomes infinite to the code sequence in which the maximum run k becomes finite.

The demodulating apparatus of the invention is characterized by providing a converting means (for example, a channel bit sequence converting unit 32 of FIG. 2) for converting a code sequence replaced when the minimum run d is repeated to the predetermined code sequence from the run-length limited code sequence.

The demodulating apparatus of the invention is characterized by providing a converting means (for example, a channel bit sequence converting unit 32 of FIG. 2) for converting a code sequence replaced when the maximum run k is infinite to the predetermined code sequence from the run-length limited code sequence.

Figure 1:
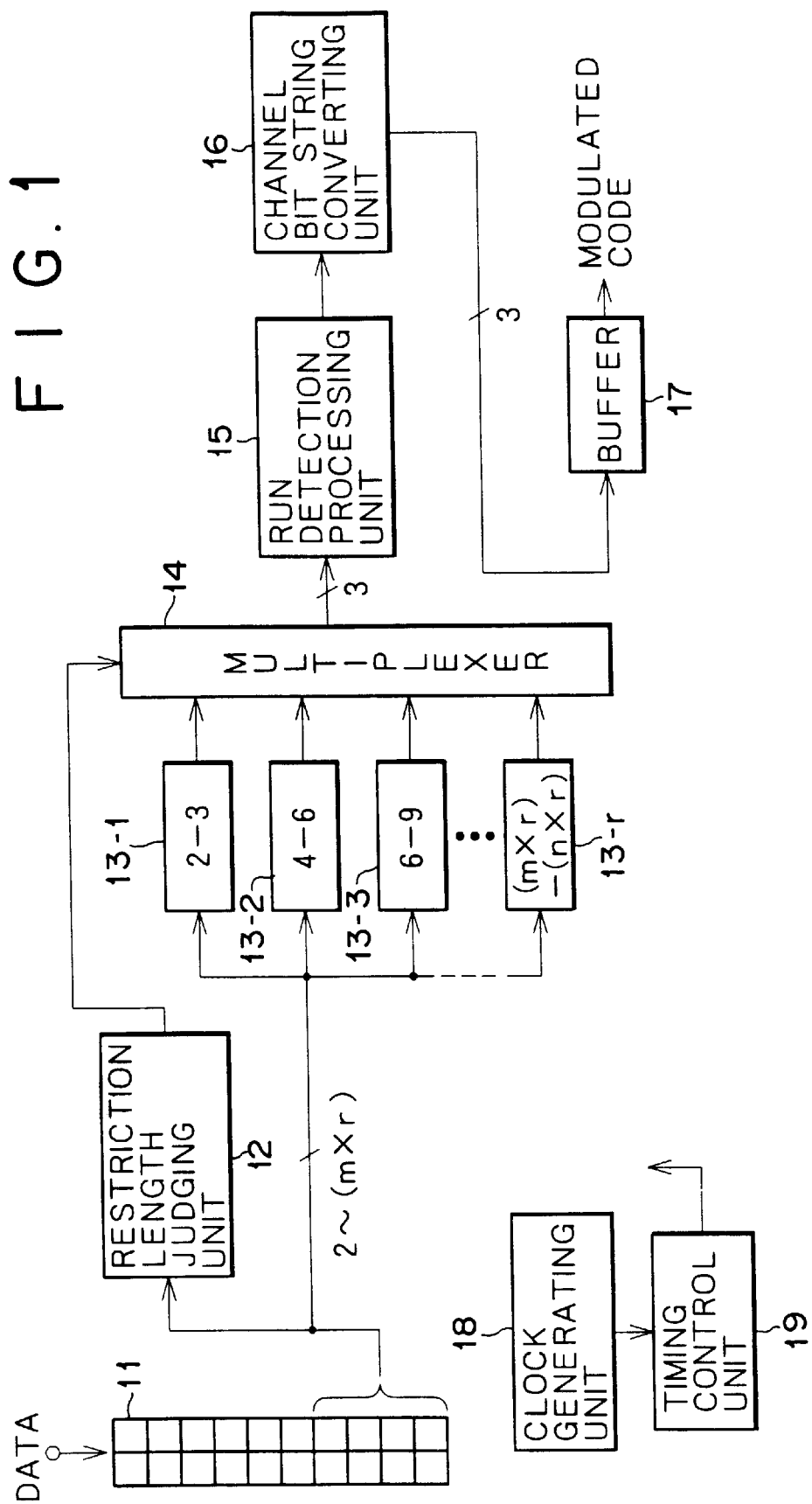
FIG. 1 is a block diagram showing a structure of a preferred embodiment of the modulating apparatus of the present invention.

FIG. 1 shows a circuit structure of the modulating apparatus for conversion by using the conversion table shown in Table 1 when the variable length code in the present invention (d, k; m, n; r) is for example (1, 7; 2, 3; 2), that is, when the minimum run d of 0 is 1 bit, the maximum run k of 0 is 7 bits, basic data length m is 2 bits, basic code length n is 3 bits and maximum restriction length r is 3 bits.

A shift register 11 is designed to output the data, while it is shifted in 2 bit units, to a restriction length judging unit 12 and all conversion units 13-1 to 13-r.

The restriction length judging unit 12 is designed to output the data to a multiplexer 14 by judging the restriction length of data i. The converting units 13-1 to 13-r refer to the built-in conversion table, determines whether the conversion rule corresponding to the data supplied is registered or not and outputs the converted code to the multilexer 14 after the data conversion when the conversion rule is registered. Moreover, if data is not registered to the conversion table, the converting units 13-1 to 13-r are designed to destroy the data supplied.

When uncertain bit is included in the converted code, the converting units 13-1 to 13-r sets this uncertain bit to 1 and then outputs the code.

The multiplexer 14 selects the code converted by the converting unit 13-1 corresponding to the restriction length i supplied from the restriction length judging unit 12 and then outputs such code to the run detecting and processing unit 15 via a serial data.

The run detecting and processing unit 15 detects the run of which run-length (number of repeated "0"s) is smaller than the minimum run d in the serial data supplied to change the value of the predetermined uncertain bit to "0" from "1".

The run detecting and processing unit 15 sets the length of all runs to the value larger than the minimum run d as explained above (since generation of runs larger than the maximum run k is eliminated by completely setting the value of uncertain bit to 1 in the converting unit 13-i, the length of all runs is larger than the minimum run d but is smaller than the maximum run k) . The run detecting and processing unit 15 outputs the data to a channel bit sequence converting unit 16.

The channel bit sequence converting unit 16 detects existence or not-existence of the particular code sequence, for example, in this case, the particular code sequence where the minimum run is repeated. When the particular code sequence exists, it is then converted to the predetermined channel bit sequence. Search of the particular code sequence in the channel bit sequence converting unit 16 is performed in the n-bit unit or 3-bit unit in the example of FIG. 1. Moreover, an output from the channel bit sequence converting unit 16 is output to a buffer 17 as the serial data.

The buffer 17 stores once the code sequence output from the channel bit sequence converting unit 16 and outputs the code sequence as the modulated signal in the predetermined transfer rate.

A block generating unit 18 generates the clock and the timing control unit 19 generates the timing signal synchronously with the clock supplied from the clock generating unit 18 and then supplies this timing signal to the shift register 11, restriction length judging unit 12 and buffer 17.

Next, operation of this embodiment will be explained below.

The data is supplied in the 2-bit unit to the converting units 13-1 to 13-r and restriction length judging unit 12 by the shift register 11. The restriction length judging unit 12 comprises the conversion table shown in Table 1 and judges the restriction length i of the data by referring to this conversion table and then outputs the judging result (restriction length i) to the multiplexer 14.

On the other hand, the converting units 13-1 to 13-r respectively have the tables corresponding to each restriction length i and uses the conversion rule, when the conversion rule corresponding to the data supplied is registered to such table, to convert the data of 2xi bits supplied to the code of 3xi bits and also outputs, when the uncertain bit is included in the converted code, the code to the multiplexer 14 after setting the uncertain bit value to 1.

The multiplexer 14 receives the code from the converting unit 13-i corresponding to the restriction length i supplied from the restriction length judging unit 12 and then outputs such code to the run detecting and processing unit 15 as the serial data.

The run detection and processing unit 15 detects the run smaller than the minimum run d (=1) in the serial data supplied and performs the NRZI modulation, after the uncertain bit value adjacent to the end part of the run is changed to "0" from "1", to output the NRZI-modulated code as the modulated code.

As explained above, when the restriction length i of input data is judged, code conversion is performed corresponding to the restriction length i and an uncertain bit is included in the code at the time of conversion, a value of such uncertain bit is once set to 1. Next, the value of uncertain bit is reset to the correct value by detecting the run smaller than the minimum run d and then changing a value of the uncertain bit adjacent to the end part of the run to "0" from "1". As explained above, an output of the run detecting and processing unit 15 becomes identical to the code sequence generated by the conversion table shown in Table 1.

The code sequence output from the run detecting and processing unit 15 is input to the channel bit sequence converting unit 16. The channel bit sequence converting unit 16 detects the particular code sequence, for example, in this case, the particular pattern (described later) in which the minimum run is repeated, from the input code sequence and replaces the particular pattern, when it is detected, to the predetermined channel bit sequence and then outputs it to the buffer 17. The buffer 17 once stores the input code sequence and then outputs it in the predetermined transfer rate. The code sequence output as explained above becomes identical to the code sequence generated by the conversion table shown in Table 7.

As explained above, the code sequence output from the run detecting and processing unit 15 is the code sequence generated by the conversion table (variable length RLL(1-7)) shown in Table 1 and an output becomes the code sequence generated by the conversion table (variable length RML (1-7)) shown in Table 7 by inputting such code sequence to the channel bit sequence conversing unit 16. In other words, the left side (front stage) in FIG. 1 of the run detecting and processing unit 15 and channel bit sequence converting unit 16 shows the structure similar to that of the modulating apparatus for the variable length RLL(1-7) code of Table 1 and it becomes the structure of the modulating apparatus of the variable length RML (1-7) code of Table 7 as the total structure of circuit shown in FIG. 1 by adding the right side (latter stage) thereof.

When the channel bit sequence converting unit 16 is designed depending on the Table 7, the particular code sequence becomes "010 101 010". For the actual detection, if the particular code sequence immediately follows "0001", "100" such particular code sequence is eliminated in order to discriminate the conversion of data "0010" in Table 7 to "000010" and the conversion of data "0000" to "100010".

As explained above, when "010" or "101" or "001" is immediately followed by "010 101 010 ", the conversion process is performed in the channel bit sequence converting unit 16. The new code sequence converted is "100 000 010" from the Table 7 and it means replacement of nine bits. However, since the heading bit of the conversion bits is "1", when the converted nine bits immediately follows "1", the minimum run d=1 can be maintained by replacing "1" with "0", because the bit immediately before the nine bits to be converted may becomes "x" in the table in the conversion code sequence in the Table 1(Table 7) and "1" is given to "x" in the preceding code sequence, as a result of replacement to the new code sequence but "0" can be given to "x" as a result of new replacement. Replacement of "1" immediately before nine bits to be converted and "0" does not give any influence on the demodulation. Therefore, the RML code can be generated after all by converting the data "010 101 010" to the code sequence "100 000 010" in the channel bit sequence converting unit 16 of FIG. 1.

Moreover, it is enough that the pattern which is not generated depending on the Table 1 which is the conversion table of the RLL code of fixed length is selected as the new code sequence to be converted. The pattern not generated in the conversion table of Table 1 is shown below.

```
[0 0 0     0 0 0     0 0 0]    (1)
[0 0 0     0 0 0     0 0 1]    (2)
[0 0 0     0 0 0     0 1 0]    (3)
[1 0 0     0 0 0     0 0 0]    (4)
[1 0 0     0 0 0     0 0 1]    (5)
[1 0 0     0 0 0     0 1 0]    (6)
```

From (1) to (6) above, the data is converted to the format of the variable length table code, following four new replaced code sequences can be generated.

```
[0 0 0     0 0 0     0 0 x]    (A)
[0 0 0     0 0 0     0 1 0]    (B)
[1 0 0     0 0 0     0 0 x]    (C)
[1 0 0     0 0 0     0 1 0]    (D)
```

The pattern (D), namely the pattern (6) among the above patterns has already been explained. In this case, replacement can be performed while the minimum run and maximum ran can be maintained.

However, in the case other than that explained above, the minimum run is maintained but the maximum run becomes larger than k=7 in the related art. However, these may be selected as the new code sequence to be replaced and it can also be demodulated. For instance, from (C), the RML code sequence can be generated, in the channel bit sequence converting unit 16 of FIG. 1, through the conversion of data "010 101 010" to the code sequence "100 000 00x".

As the other example, the variable length RML table assigns, additionally, the code sequence "100 000 010" to "01 10 01" as the particular code and it can also be obtained as the next Table 13. The demodulation table corresponding to the modulation table of Table 13 is shown as the Table 14.

TABLE 13

RML (1, 7; 2, 3; 3) Part 2

| | Data | Code |
|---|---|---|
| i = 1 | 1 1 | 0 0 x |
| | 1 0 | 0 1 0 |
| | 0 1 | 1 0 x |
| i = 2 | 0 0 1 1 | 0 0 0 0 0 x |
| | 0 0 1 0 | 0 0 0 0 1 0 |
| | 0 0 0 1 | 1 0 0 0 0 x |
| | 0 0 0 0 | 1 0 0 0 1 0 |
| i = 3 | 0 1 1 0 0 1 | 1 0 0 0 0 0 0 1 0 |

"x" in the Table 13 is determined by the complement of the following code bits. In this case, the minimum run is repeated up to five times in maximum.

TABLE 14

DEM-RML (1, 7; 2, 3; 3) Part 2

| | Code sequence | Demodulated data sequence |
|---|---|---|
| i = 1 | 0 0 1 | 1 1 |
| | 0 0 0 1 | 1 1 |
| | 0 1 0 | 1 0 |
| | 1 0 1 | 0 1 |

TABLE 14-continued

DEM-RML (1, 7; 2, 3; 3) Part 2

| | Code sequence | Demodulated data sequence |
|---|---|---|
| | 1 0 0 1 | 0 1 |
| i = 2 | 0 0 0  0 0 — | 0 0 1 1 |
| | 0 0 0  0 1 — | 0 0 1 0 |
| | 1 0 0  0 0 1 | 0 0 0 1 |
| | 1 0 0  0 0 0 1 | 0 0 0 1 |
| | 1 0 0  0 1 — | 0 0 0 0 |
| i = 3 | 1 0 0  0 0 0  0 1 — | 0 1 1 0 0 1 |

In this case, the structure of the modulating apparatus is similar to FIG. 1. When the channel bit converting unit 16 in FIG. 1 is produced depending on the Table 13, the particular code sequence is "101 010 101". In this case, only 9 bits of the particular code sequence explained above is detected and it can be discriminated from the others without making reference to the front and rear bits of the 9 bits and thereby the channel bit sequence converting unit 16 can perform the conversion process. The new code sequence to be converted can be replaced through replacement of nine bits with "100 000 010" from the Table 13. In this case, it is no longer required to perform the particular process because any contradiction is not generated immediately before and after the conversion. Therefore, the RML code sequence shown in Table 13 can be generated by the conversion of the data "101 010 101" to the code sequence "100 000 010" in the channel bit sequence converting unit 16.

The code sequence converted to the new code sequence by the channel bit sequence converting unit 16 should have, at the time of demodulation, the variable length demodulation table including the new coding rule. Therefore, if the new code sequence does not have the variable length demodulation table including the new coding rule, in other words, it has the demodulation table corresponding to the modulation table shown in FIG. 1 as the demodulation table, it is required to provide the circuit to detect the particular code sequence in the preceding stage of the demodulating apparatus for demodulating this code and convert the code sequence to the predetermined code sequence.

Figure 2:
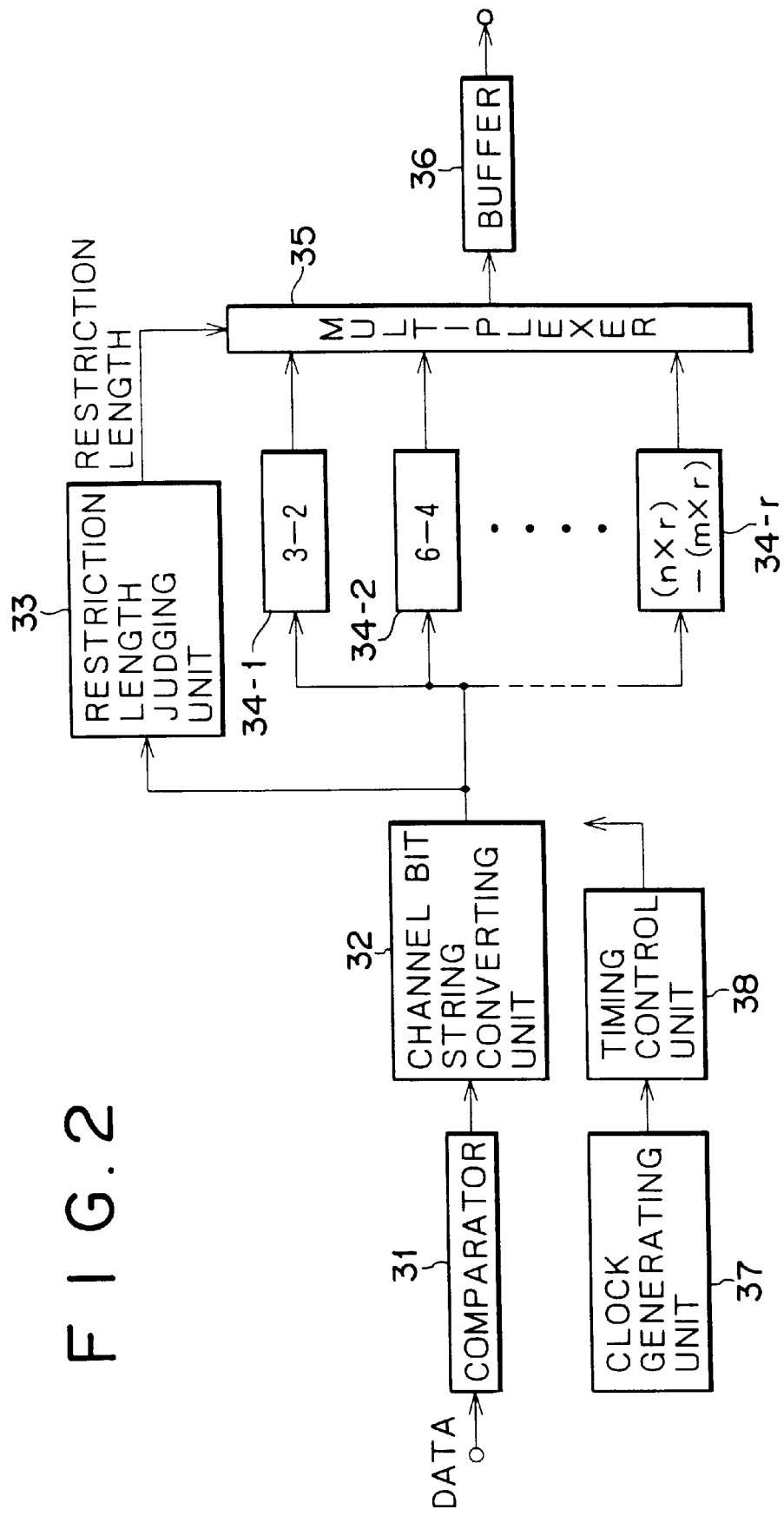
FIG. 2 is a block diagram showing a structure of a preferred embodiment of the demodulating apparatus of the present invention.

FIG. 2 shows a demodulating apparatus which assures demodulation corresponding to the modulation table shown in the Table 7 by adding the channel bit sequence converting unit 32 to the demodulating circuit having the demodulation table corresponding to the modulation table shown in the Table 1.

The data input to the comparator 31 is converted to two levels of "1" and "0" and is then output to the channel bit sequence converting unit 32. The comparator 31 further performs inverse NRZI encoding (edge code) when the code is coded by the NRZI coding method (level code).

The channel bit sequence converting unit 32 detects the particular data sequence (channel bit sequence) in the 3-bit unit of the input data. When the input data is detected, this data sequence is converted to the other data sequence and is then output in the 3-bit unit while the timing is controlled by the timing control unit 38, which receives a clock signal from clock generating unit 37. Moreover, if the particular data sequence is not detected, it is output in the 3-bit unit while the timing is controlled by the timing control unit 38, which receives a clock signal from clock generating unit 37. The restriction length judging unit 33 judges the restriction length I of the data output from the channel bit sequence converting unit 32 and then outputs the result to the multiplexer 35.

The inverse conversion tables 34-1 to 34-r have the tables for inversely converting the variable length code of n×i bits to the data of m×i bits. The multiplexer 35 selects any data from the inverse conversion tables 34-1 to 34-r and then outputs is as the serial data. The buffer 36 outputs once stores the data from the multiplexer 35 and then outputs the data as the reproduced data. The timing control unit 38 generates the timing signal and then supplies this timing signal to the comparator 31, channel bit sequence converting unit 32, restriction length judging unit 33 and multiplexer 35.

Then, operation of the timing control unit will be explained. The transmitted data is input to the comparator 31 and is then compared with the predetermined reference level to generate a two-level(binary) code. The data output from the comparator 31 is then converted to the digital signal of inverse NRZI code (the code in which "1" indicates the edge) and then input to the channel bit sequence converting unit 32 to detect the particular data sequence. When the particular data sequence is detected, it is converted to the other data sequence and is then output to the restriction length judging unit 33 and each inverse conversion table 34-1 to 34-r.

The restriction judging unit 33 has the conversion t able shown the Table 2 to judge the restriction length of the input data sequence and then outputs the result of judgment to the multiplexer 35. Moreover, the inverse conversion tables 34-1 to 34-r have the table corresponding to each restriction length i, converts the input data sequence depending on the table and then outputs the converted data to the multiplexer 35. The multiplexer 35 selects the output from the inverse conversion table 34-i corresponding to the restriction length i supplied from the restriction length judging unit 33 and then outputs the output to the buffer 3a6 as the serial data.

FIG. 2 shows the structure, in its right side (latter stage) of an output of the channel bit sequence converting unit 32, similar to the demodulating apparatus for the variable length RLL (1-7) code of Table 2 and forms the structure of the demodulating apparatus of the variable length RML (1-7) code of Table 8 as the entire part of FIG. 2.

Here, when the channel bit sequence converting unit 32 of FIG. 2 is produced depending on the Table 8, the particular code sequence is "100 000 010". When this code sequence is detected, the conversion process is performed in the channel bit sequence converting unit 32 of FIG. 2. The converted new code sequence is "010 101 010". In this conversion, reference is made only to the nine bits of the channel bit sequence. Thereby, the demodulation can be performed in the table of Table 2 through the conversion of data "100 000 010" to the code sequence "010 101 010" in the channel bit sequence converting unit 32 of FIG. 2.

As the other example, when the channel bit sequence converting unit 32 is produced depending on the Table 14, the predetermined code sequence is "100 000 010". When this code sequence is detected, the conversion process is performed in the channel bit sequence converting unit 32 of FIG. 2. The converted new code sequence is "101 010 101". In this conversion, reference to the channel bit sequence is made only to nine bits. Therefore, since the RLL code sequence in the Table 1 can be generated by conversion of data "100 000 010" to the code sequence "101 010 101" in the channel bit sequence converting unit 32 of FIG. 2.

Here, the conversion using the variable length RML code as shown in the Table 7 or Table 13 assures generation of less amount of error at the time of recording data to a recording medium and stable reproduction. Therefore, any problem is never generated even when an output of the channel bit sequence converting unit 32 of FIG. 2 becomes the code sequence in which repeating of the minimum run is not restricted.

Figure 3:
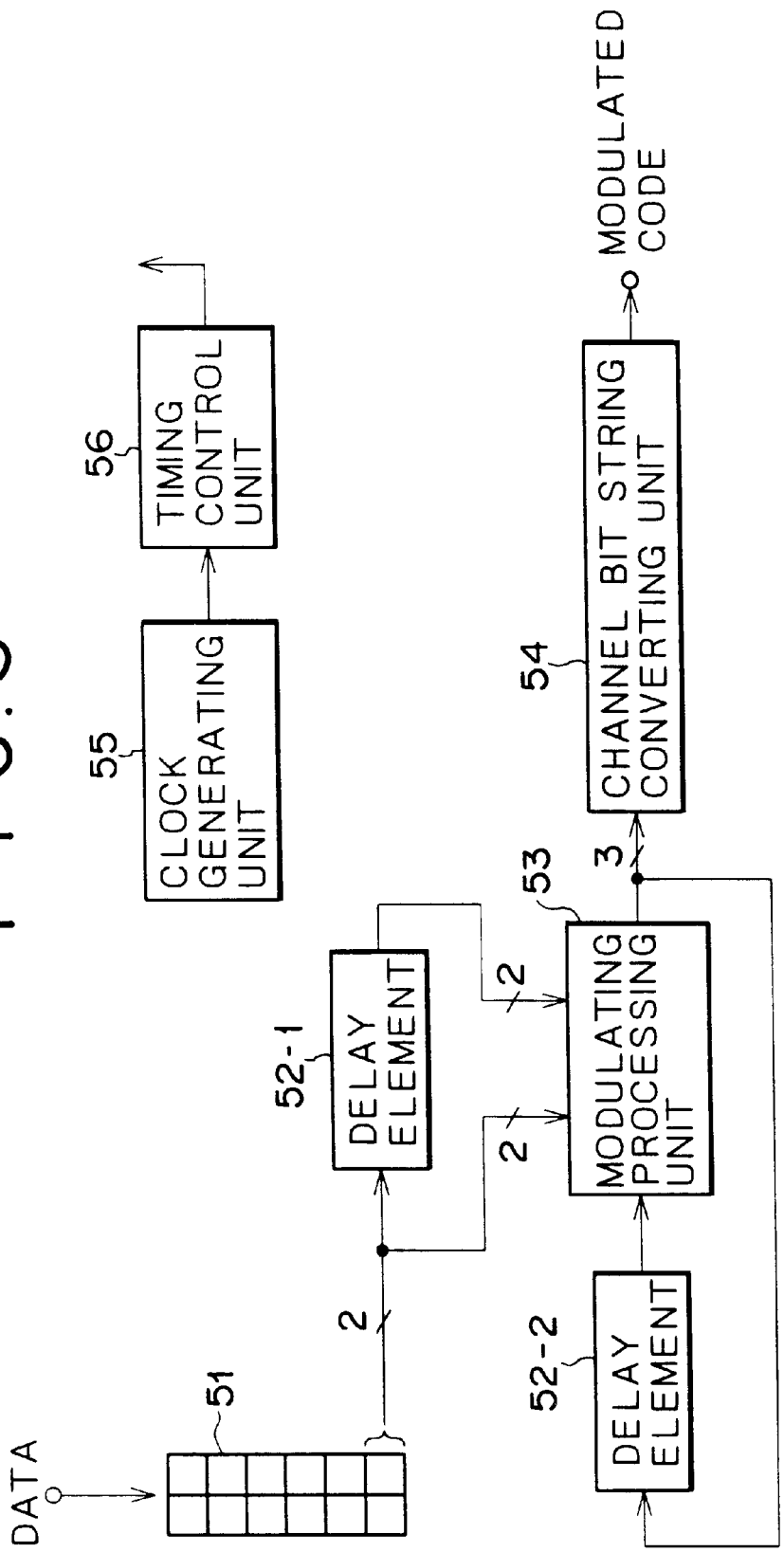
FIG. 3 is a block diagram showing a structure of another embodiment of the modulating apparatus of the present invention.

The modulating apparatus shown in FIG. 3 is an embodiment using the conversion table 3 of the fixed length RLL(1-7) code. The parameter should be (1, 7; 2, 3; 1). A shift register 51 divides the input data in unit of 2 bits and then outputs the bits to the modulation processing unit 53 and delay element 52-1. To the modulation processing unit 53, the data of 2-bit output from the delay element 52-1 is also supplied. After all, the data of four bits in total including the current data of 2-bit and the next data of 2-bit are supplied to the modulation processing unit 53. In addition, an output of the modulation processing unit 53 is supplied again to the modulation processing unit 53 via the delay element 52-2.

The modulation processing unit 53 outputs the data of 3-bit to the channel bit sequence converting unit 54. The clock generating circuit 55 generates the predetermined channel clock and then outputs the clock to the timing control unit 56. The timing control unit 56 generates the timing signal synchronized with the input channel lock and outputs the timing signal to each unit.

Next, the operation will then be explained. The data output from the shift register 51 is then input to the delay element 52-1, shifted by two bits and is then output to the modulation processing unit 53. In addition, an output from the shift register 51 is also supplied to the modulation processing unit 53 and after all, data of current block and data of the next block (total of continuous 4 bits) are input to the modulation processing unit 53.

The modulation processing unit 53 has he table shown in the Table 3 and converts the input data to the code sequence depending on the conversion rule. That is, the conversion to the code sequence is performed by referring to the current data word, next data word and the immediate preceding word re-input via the delay element 52-2 from the output signal.

The code sequence of 3 bits output from the modulation processing unit 53 is then input to the channel bit sequence processing unit 54. The channel bit sequence processing unit 54 detects the particular channel bit sequence, namely, in this case, the particular pattern in which he minimum run is repeated from the input code sequence of 3-bit and replaces the particular pattern, when it is detected, with the predetermined channel bit sequence and then output this channel bit sequence.

An output of the channel bit sequence converting unit 54 becomes identical to the code sequence generated by the fixed length RML (1-7) table in the Table 9. That is, the fixed code sequence generated by the RLL (1-7) table in the Table 3 can be converted to the fixed length RML (1-7) code sequence by adding the channel bit sequence converting unit 54 to the latter stage.

In other words, in FIG. 3, the left side (front stage) of the modulation processing unit 53 and channel bit sequence converting unit 54 is the structure similar to the modulating apparatus using the fixed length RLL (1-7) code shown in the Table 3 and it becomes identical to the structure of the modulating apparatus using the fixed length RML (1-7) code shown in the Table 9 in the total structure of FIG. 3 by adding the right side (latter stage).

Here, when the channel bit sequence converting unit 54 is produced depending on the Table 9, the particular code sequence is "101 010 101". When this code sequence is detected, the channel bit sequence converting unit 54 performs the code conversion. The converted new code sequence is "100 000 001". In this conversion, reference is made only to the nine bits of the channel bit sequence. Thereby, the RML code sequence of the Table 9 can be generated after all by the conversion from "101 010 101" to "110 000 001" in the channel bit sequence converting unit 54 FIG. 3.

Moreover, since the RML (1-7) code sequence shown in the Table 11 can be generated by conversion from "101 010 101" to "100 000 001" in the channel bit sequence converting unit 54 of FIG. 3, the modulating apparatus shown in FIG. 3 may also be used for the Table 5 which is the conversion table of the fixed length RLL(1-7) code.

Moreover, the pattern which is not generated by modulation of the Table 3 or Table 5 as the RLL code may be enough as the converted new code sequence. Such patterns are shown below.

| [0 0 0 | 0 0 0 | 0 0 0] | (1) |
| [0 0 0 | 0 0 0 | 0 0 1] | (2) |
| [0 1 0 | 0 0 0 | 0 0 0] | (3) |
| [0 1 0 | 0 0 0 | 0 0 1] | (4) |
| [1 0 0 | 0 0 0 | 0 0 0] | (5) |
| [1 0 0 | 0 0 0 | 0 0 1] | (6) |

Replacement by the pattern (6) among above patterns has already been explained. In this case, replacement may be made while maintaining the minimum run and maximum run.

When the pattern is replaced to the pattern (4), such replacement is also possible while maintaining the minimum run and maximum run. That is, the code sequence RML (1-7) may be generated by the conversion to "010 000 001" from "101 010 101" in the channel bit sequence converting unit 54 of FIG. 3.

In the patterns (1), (2), (3) and (5) other than that explained above, the minimum run may be maintained by the maximum run k is changed to a large value from 7. However, even when a pattern is selected as the new replacing code sequence, it can also be demodulated as it was. For example, the RML code sequence may be generated, from the pattern (5), by the conversion from "101 010 101", to "100 000 000" in the channel bit sequence converting unit 54 of FIG. 3.

By the way, the new code sequence converted to the new code sequence by the channel bit sequence converting unit 54 should have, at the time of demodulation, the fixed length demodulation table including these new code rule If the new code sequence does not have the fixed length demodulation table including the new code rule, for example, when such new code sequence has the demodulation table corresponding to the table of Table 3(Table 5) as the demodulation table, the RML (1-7) code sequence can be demodulated by adding, to the preceding stage of the demodulating apparatus for demodulating such code sequence, the circuit for detecting the particular code sequence and then converting this code sequence to the predetermined code sequence.

Figure 4:
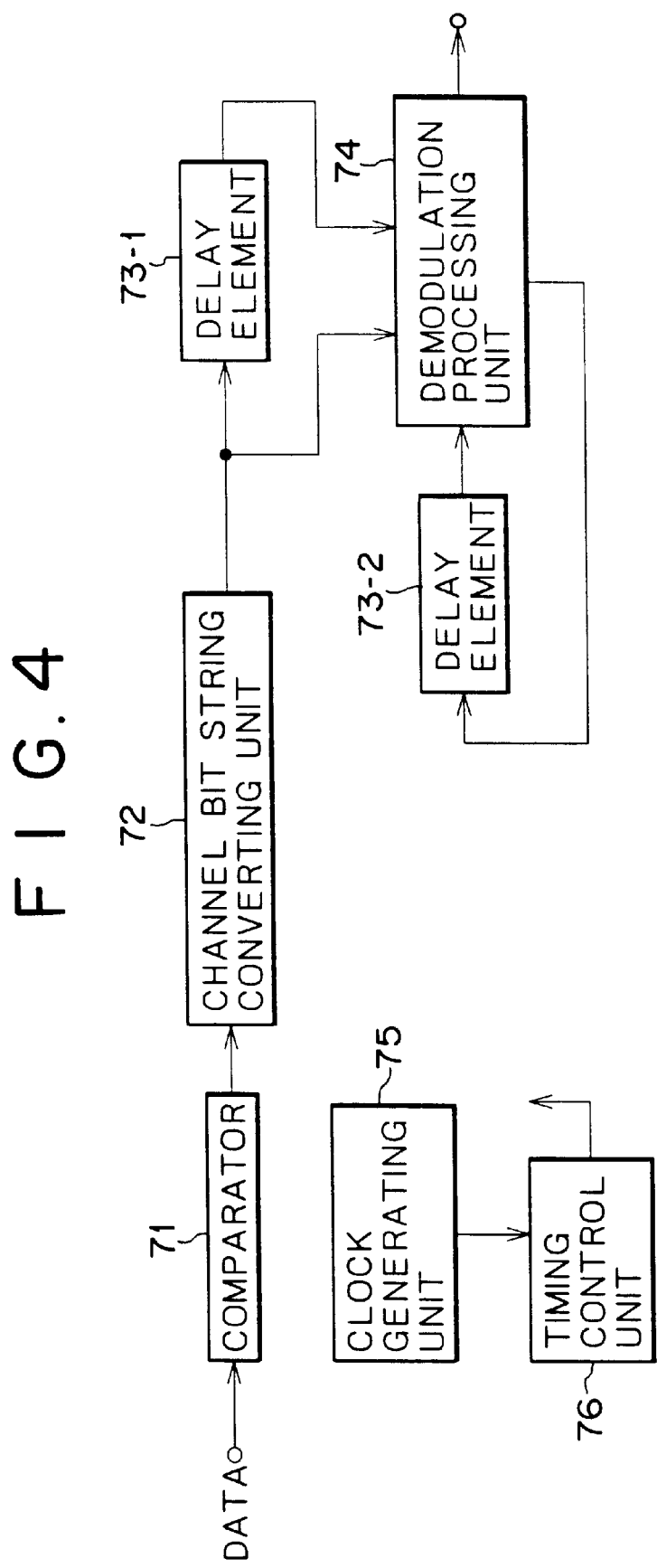
FIG. 4 is a block diagram showing a structure of another embodiment of the demodulating apparatus of the present invention.

FIG. 4 is a block diagram showing a structure of the demodulating apparatus using the demodulating circuit corresponding to the fixed length RML (1-7) code shown in the Table 10 obtained by adding the channel bit sequence converting unit 72 to the demodulating circuit having the demodulation table using the fixed length RLL(1-7) code shown in the Table 4 The data input to the demodulating apparatus is converted to the binary value of "0" and "1" by the comparator 71 and is then output to the channel bit converting unit 72.

The channel bit converting unit 72 detects the particular data sequence (channel bit sequence) from the input data. When the particular data sequence is detected, this data sequence is converted to the other data sequence and is then output in the 3-bit unit. Moreover, if the particular data sequence is not detected, the input data is output in direct in the 3-bit unit.

The data output in the 3-bit unit is then input to the demodulation processing unit 74. To this demodulation processing unit 74, the data of 3-bit output from the delay element 73-2 is also input and after all total of 6-bit data including the current 3-bit data and the next 3-bit data is supplied to the demodulation processing unit 74. In addition, at least two bits from the last bit among the 3-bit data demodulated in the demodulation processing unit 74 are supplied again to the demodulation processing unit 74 via the delay element 73-2.

The clock generating unit 75 generates the predetermined channel clock and outputs it to the timing control unit 76. The timing control unit 76 generates the timing signal synchronized with the input channel clock and then outputs it to each unit.

Operation will then be explained next The comparator 71 performs the operation similar to the comparator 31 of FIG. 2 and therefore the same explanation will be omitted here. The comparator 71 provides an output to t he channel bit sequence converting unit 72. This channel bit sequence converting unit 72 detects the particular data sequence (channel bit sequence) from the input data. When the particular data sequence is detected, it is converted to the other data sequence and then outputs it. Moreover, when the particular data sequence is not detected, the input data is output in direct.

The output data is then input to the delay element 73-1 and demodulation processing unit 74. The demodulation processing unit 74 converts the data to the data word depending on the demodulation table of the fixed length RLL (1-7) code shown in the Table 4. That is, reference is made to the immediately preceding code word of the reinput from the current code word, next code word and the output code word from the demodulation processing unit 74 and it is then converted to the data word.

For example, when the latter two bits of the immediately preceding codeword is "10" and the current codeword is "000", the data word of this code word becomes "00" without relation to the next code word and is then output. Moreover, for the latter processing, the latter two bits "00" of the code word is re-input to the demodulation processing unit 74 for the post-processing. In addition, as the immediately preceding code word input to the demodulation processing unit 74, the three bits of the current code word or latter two bits of the code word are used.

Therefore, in FIG. 4, the right side (latter stage) of the output of the channel bit sequence converting unit 72 has the structure similar to that of the demodulating apparatus using the fixed length RLL(1-7) code of the Table 4 and the structure of FIG. 4 as a whole shows the demodulating apparatus corresponding to the fixed length RML (1-7) code of the Table 10 by adding the left side (preceding stage) of the structure.

Here, the channel bit sequence converting unit 72 is produced depending on the Table 10, the predetermined code sequence is "100 000 001". When this code sequence is detected, the channel bit sequence converting unit 72 performs the conversion processing. The converted new code sequence is "101 010 101". In this conversion, reference is made only to above 9 bits of the channel bit sequence. Therefore, the demodulation using the fixed length RLL (1-7) shown in the Table 4 can be realized by converting "100 000 001" to "101 010 101" in the channel bit sequence converting unit 72 of FIG. 4.

Here, any problem is never generated if an output of the channel bit sequence converting unit 72 in the demodulating apparatus becomes the code sequence where repeating of the minimum run is not restricted, because the conversion using the RML (1-7) code in the Table 9 is performed with less generation of error at the time of recording to the recording medium and with more stable reproduction.

Also for the RML (1-7) code which is the same result of the conversion using the Table 12 by FIG. 3 of the data modulated using the fixed length RLL (1-7) code shown in the Table 5, decoding can be performed with the decoding table using the RLL (1-7) code shown in the Table 6 by converting "100 000 001" to "101 010 101" in the channel bit sequence converting unit 72.

The similar process can be realized even with the VFM code as the other embodiment of the embodiment explained above.

The modulation table of VFM (Variable Five Modulation) is as shown below. Moreover, the variable length code of the minimum run d=4 is called VFM. The parameter of the VFM is (4, 22; 2, 5; 5) and when the bit interval of the recording waveform sequence is defined as T, the minimum inversion interval Tmin becomes 5(=4+1)T. Namely, when the bit interval of the data sequence is defined as Tdata, the minimum inversion interval Tmin becomes 2.00 (=(2/5)×5) Tdata. Moreover, the maximum inversion interval Tmax is 23T(9.20Tdata). In addition, the detection window width Tw becomes 0.40(=2/5)T. Table 15 shows the conversion table using the VFM code.

TABLE 15

RLL (4, 22; 2, 5; 5) : VFM (table where d = 4 and Tmax is finite)

| | Data | | Code | | | |
|---|---|---|---|---|---|---|
| i = 1 | 11 | 00000 | | | | |
| | 10 | 10000 | | | | |
| i = 2 | 0111 | 01000 | 00000 | | | |
| | 0110 | 00100 | 00000 | | | |
| | 0101 | 00010 | 00000 | | | |
| | 0100 | 00001 | 00000 | | | |
| i = 3 | 001111 | 01000 | 01000 | 00000 | | |
| | 001110 | 01000 | 00100 | 00000 | | |
| | 001101 | 01000 | 00010 | 00000 | | |
| | 001100 | 01000 | 00001 | 00000 | | |
| | 001011 | 00010 | 00001 | 00000 | | |
| | 001010 | 00100 | 00100 | 00000 | | |
| | 001001 | 00100 | 00010 | 00000 | | |
| | 001000 | 00100 | 00001 | 00000 | | |
| | 000111 | 00010 | 00010 | 00000 | | |
| | #111111 = | 00001 | 00001 | 00000 | | |
| i = 4 | 00011011 | 01000 | 01000 | 01000 | 00000 | |
| | 00011010 | 01000 | 01000 | 00100 | 00000 | |
| | 00011001 | 01000 | 01000 | 00010 | 00000 | |
| | 00011000 | 01000 | 01000 | 00001 | 00000 | |
| | 00010111 | 01000 | 00010 | 00001 | 00000 | |
| | 00010110 | 01000 | 00100 | 00010 | 00000 | |
| | 00010101 | 01000 | 00100 | 00010 | 00000 | |
| | 00010100 | 01000 | 00100 | 00001 | 00000 | |
| | 00010011 | 01000 | 00010 | 00010 | 00000 | |
| | 00010010 | 00100 | 00100 | 00100 | 00000 | |
| | 00010001 | 00100 | 00100 | 00010 | 00000 | |

TABLE 15-continued

RLL (4, 22; 2, 5; 5) : VFM (table where d = 4 and Tmax is finite)

| | Data | | Code | | | |
|---|---|---|---|---|---|---|
| | 00010000 | 00100 | 00100 | 00001 | 00000 | |
| | 00001111 | 00100 | 00001 | 00001 | 00000 | |
| | 00001110 | 00100 | 00001 | 00001 | 00000 | |
| | 00001101 | 00100 | 00010 | 00010 | 00000 | |
| | 00001100 | 01000 | 00010 | 00001 | 00000 | |
| | 00001011 | 01000 | 00001 | 00001 | 00000 | |
| | 00001010 | 00001 | 00001 | 00001 | 00000 | |
| | 00001001 | 00010 | 00010 | 00010 | 00000 | |
| | 00001000 | 00010 | 00010 | 00001 | 00009 | |
| i = 5 | 0000011111 | 01000 | 01000 | 01000 | 01000 | 00000 |
| | 0000011110 | 01000 | 01000 | 01000 | 00100 | 00000 |
| | 0000011101 | 01000 | 01000 | 01000 | 00010 | 00000 |
| | 0000011100 | 01000 | 01000 | 01000 | 00001 | 00000 |
| | 0000011011 | 01000 | 01000 | 00010 | 00001 | 00000 |
| | 0000011010 | 01000 | 01000 | 00100 | 00100 | 00000 |
| | 0000011001 | 01000 | 01000 | 00100 | 000100 | 00000 |
| | 0000011000 | 01000 | 01000 | 00100 | 000001 | 00000 |
| | 0000010111 | 01000 | 01000 | 00010 | 000010 | 00000 |
| | 0000010110 | 01000 | 00100 | 00100 | 000100 | 00000 |
| | 0000010101 | 01000 | 00100 | 00100 | 00010 | 00000 |
| | 0000010100 | 01000 | 00100 | 00100 | 00001 | 00000 |
| | 0000010011 | 01000 | 00010 | 00001 | 00001 | 00000 |
| | 0000010010 | 01000 | 00100 | 00001 | 00001 | 00000 |
| | 0000010001 | 01000 | 00100 | 00010 | 00010 | 00000 |
| | 0000010000 | 01000 | 00100 | 00010 | 00001 | 00000 |
| | 0000001111 | 01000 | 01000 | 00001 | 00001 | 00000 |
| | 0000001110 | 01000 | 00001 | 00001 | 00001 | 00000 |
| | 0000001101 | 01000 | 00010 | 00010 | 00010 | 00000 |
| | 0000001100 | 01000 | 00010 | 00010 | 00001 | 00000 |
| | 0000001011 | 00100 | 00100 | 00010 | 00010 | 00000 |
| | 0000001010 | 00100 | 00100 | 00100 | 00100 | 00000 |
| | 0000001001 | 00100 | 00100 | 00100 | 00010 | 00000 |
| | 0000001000 | 00100 | 00100 | 00100 | 00001 | 00000 |
| | 0000000111 | 00100 | 00100 | 00010 | 00001 | 00000 |
| | 0000000110 | 00100 | 00100 | 00001 | 00001 | 00000 |
| | 0000000101 | 00100 | 00010 | 00010 | 00010 | 00000 |
| | 0000000100 | 00100 | 00010 | 00010 | 00001 | 00000 |
| | 0000000011 | 00100 | 00001 | 00001 | 00001 | 00000 |
| | 0000000010 | 00010 | 00010 | 00001 | 00001 | 00000 |
| | 0000000001 | 00010 | 00010 | 00010 | 00010 | 00000 |
| | 0000000000 | 00010 | 00010 | 00010 | 00010 | 00000 |

: Special conversion table for limiting Tmax

Here, the table in the Table 15 used to process the conversion table for limiting Tmax using the present invention becomes the next Table 16, except for the "#" part of the Table 15.

TABLE 16

RLL (4, infinite; 2, 5; 5) VFM (table where d = 4 and Tmax is infinite)

| | Data | | Code | | | |
|---|---|---|---|---|---|---|
| i = 1 | 11 | 00000 | | | | |
| | 10 | 10000 | | | | |
| i = 2 | 0111 | 01000 | 00000 | | | |
| | 0110 | 00100 | 00000 | | | |
| | 0101 | 00010 | 00000 | | | |
| | 0100 | 00001 | 00000 | | | |
| i = 3 | 001111 | 01000 | 01000 | 00000 | | |
| | 001110 | 01000 | 00100 | 00000 | | |
| | 001101 | 01000 | 00010 | 00000 | | |
| | 001100 | 01000 | 00001 | 00000 | | |
| | 001011 | 00010 | 00001 | 00000 | | |
| | 001010 | 00100 | 00100 | 00000 | | |
| | 001001 | 00100 | 00010 | 00000 | | |
| | 001000 | 00100 | 00001 | 00000 | | |
| | 000111 | 00010 | 00010 | 00000 | | |
| i = 4 | 00011011 | 01000 | 01000 | 01000 | 00000 | |
| | 00011010 | 01000 | 01000 | 00100 | 00000 | |

TABLE 16-continued

RLL (4, infinite; 2, 5; 5) VFM (table where d = 4 and Tmax is infinite)

| Data | Code | | | | |
|---|---|---|---|---|---|
| 00011001 | 01000 | 01000 | 00010 | 00000 | |
| 00011000 | 01000 | 01000 | 00001 | 00000 | |
| 00010111 | 01000 | 00010 | 00001 | 00000 | |
| 00010110 | 01000 | 00100 | 00100 | 00000 | |
| 00010101 | 01000 | 00100 | 00010 | 00000 | |
| 00010100 | 01000 | 00100 | 00001 | 00000 | |
| 00010011 | 01000 | 00010 | 00010 | 00000 | |
| 00010010 | 00100 | 00100 | 00100 | 00000 | |
| 00010001 | 00100 | 00100 | 00010 | 00000 | |
| 00010000 | 00100 | 00100 | 00001 | 00000 | |
| 00001111 | 00010 | 00001 | 00001 | 00000 | |
| 00001110 | 00100 | 00001 | 00001 | 00000 | |
| 00001101 | 00100 | 00010 | 00010 | 00000 | |
| 00001100 | 00100 | 00010 | 00001 | 00000 | |
| 00001011 | 01000 | 00001 | 00001 | 00000 | |
| 00001010 | 00001 | 00001 | 00001 | 00000 | |
| 00001001 | 00010 | 00010 | 00010 | 00000 | |
| 00001000 | 00010 | 00010 | 00001 | 00000 | |
| i = 5  0000011111 | 01000 | 01000 | 01000 | 01000 | 00000 |
| 0000011110 | 01000 | 01000 | 01000 | 01000 | 00000 |
| 0000011101 | 01000 | 01000 | 01000 | 00010 | 00000 |
| 0000011100 | 01000 | 01000 | 01000 | 00001 | 00000 |
| 0000011011 | 01000 | 01000 | 00010 | 00001 | 00000 |
| 0000011010 | 01000 | 01000 | 00100 | 00100 | 00000 |
| 0000011001 | 01000 | 01000 | 00100 | 00010 | 00000 |
| 0000011000 | 01000 | 01000 | 00100 | 00001 | 00000 |
| 0000010111 | 01000 | 01000 | 00010 | 00010 | 00000 |
| 0000010110 | 01000 | 00100 | 00100 | 00100 | 00000 |
| 0000010101 | 01000 | 00100 | 00100 | 00010 | 00000 |
| 0000010100 | 01000 | 00100 | 00100 | 00001 | 00000 |
| 0000010011 | 01000 | 00010 | 00001 | 00001 | 00000 |
| 0000010010 | 01000 | 00100 | 00001 | 00001 | 00000 |
| 0000010001 | 01000 | 00100 | 00010 | 00010 | 00000 |
| 0000010000 | 01000 | 00100 | 00010 | 00001 | 00000 |
| 0000001111 | 01000 | 01000 | 00001 | 00001 | 00000 |
| 0000001110 | 01000 | 00001 | 00001 | 00001 | 00000 |
| 0000001101 | 01000 | 00010 | 00010 | 00010 | 00000 |
| 0000001100 | 01000 | 00010 | 00010 | 00001 | 00000 |
| 0000001011 | 00100 | 00100 | 00010 | 00010 | 00000 |
| 0000001010 | 00100 | 00100 | 00100 | 00100 | 00000 |
| 0000001001 | 00100 | 00100 | 00100 | 00010 | 00000 |
| 0000001000 | 00100 | 00100 | 00100 | 00001 | 00000 |
| 0000000111 | 00100 | 00100 | 00010 | 00001 | 00000 |
| 0000000110 | 00100 | 00100 | 00001 | 00001 | 00000 |
| 0000000101 | 00100 | 00010 | 00010 | 00010 | 00000 |
| 0000000100 | 00100 | 00010 | 00010 | 00001 | 00000 |
| 0000000011 | 00100 | 00001 | 00001 | 00001 | 00000 |
| 0000000010 | 00010 | 00010 | 00001 | 00001 | 00000 |
| 0000000001 | 00010 | 00010 | 00010 | 00010 | 00000 |
| 0000000000 | 00010 | 00010 | 00010 | 00001 | 00000 |

Figure 5:
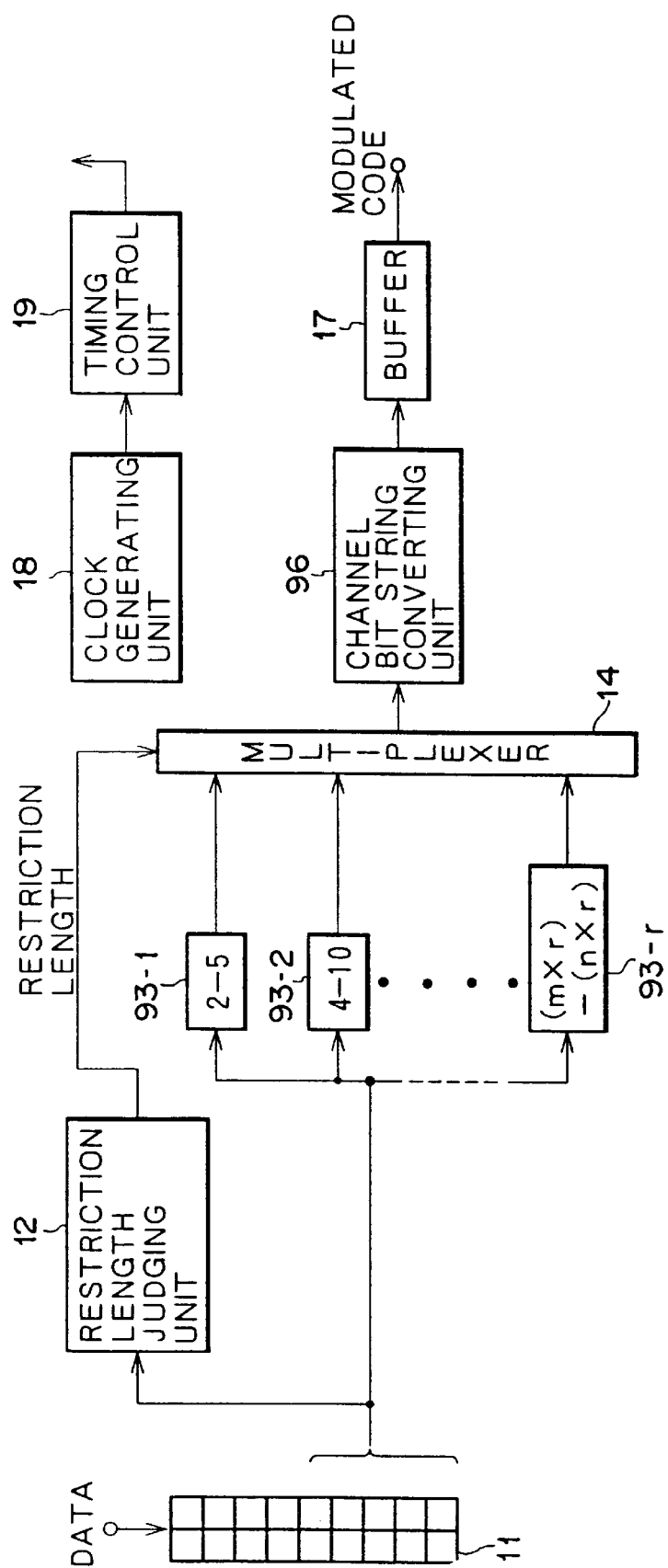
FIG. 5 is a block diagram showing a structure of the other embodiment of the modulating apparatus of the present invention.

FIG. 5 is the block diagram showing a structure of the modulating apparatus utilizing the conversion table of the Table 16 in which the VFM code having the parameter (d, k; m, n; r)=(4, 22; 2, 5; 5). The modulating apparatus of FIG. 5 has the structure realized by removing the run detection processing unit 15 from the modulating apparatus shown in FIG. 1. 93-1 to 93-r are provided with the 2–5 conversion table of the Table 16. The other structure is similar to that of FIG. 1 and therefore the explanation thereof is omitted. However, the channel bit sequence converting unit 96 detects the particular code sequence, in other words, the pattern in which the maximum run Tmax becomes infinite from the output of the multiplexer 14 and replaces, when it is detected, such particular code sequence to the code sequence of the predetermined channel bits. Moreover, detection of the particular code sequence in the channel bit sequence converting unit 96 is performed in the 5-bit unit, for example, in FIG. 5.

An output of the modulating apparatus of FIG. 5 becomes identical to the code sequence generated by the table in the Table 15. Namely, the code sequence generated by the conversion table using the VFM code in which Tmax in the table 16 becomes infinite is converted to the VFM code sequence in which Tmax becomes 23T(k=32) by adding the channel bit sequence converting unit 96 to the latter stage.

Here, when he channel bit sequence converting unit 96 of FIG. 5 is produced depending on the Table 16, the particular code sequence is "00000 00000 00000". In the case of actual detection, the codes in which the immediately preceding code sequence is not "00000" are removed. It is because the code sequence of the converted code in the Table 16 is terminated by "00000" and such discrimination is necessary. That is, when "00000", is followed by "00000 00000 00000", the channel bit sequence converting unit 96 of FIG. 5 performs the converting process. The converted new code sequence is "00001 00001 00000". Therefore, the code sequence in which the maximum run Tmax of the Table 15 can be generated by converting "00000 00000 00000" to "00001 00001 00000" in the channel bit sequence converting unit 96 of FIG. 5.

During the demodulating operation, with the similar structure to FIG. 2, the channel bit processing unit 32 detects the particular code "00001 00001 00000" and then replaces this code to "00000 00000 00000". Thereby, the reproduced data can be demodulated to the original data sequence even with the simple demodulation table of the Table 16 from the code sequence where the maximum run k=22 by the Table 15.

The converting apparatus and demodulating apparatus of the present invention are effective as the recording and reproducing apparatus for the reprogrammable media such as optical disks and magneto-optical discs.

A computer program which realizes the processes explained above can be recorded on a recording medium such as a floppy disk and CD-ROM, etc. and it can also be transmitted to users through the distribution and also transmitted via the transmission medium such as the network and by storing to a hard disks and memories.

As explained above, according to the invention, since the code sequence in which the minimum run d after the run-length limited code conversion is repeated more than the predetermined number of times is converted to the predetermined code sequence, modulation using the code having the restricted code can be performed.

According to the invention, since the code sequence in which the maximum run k after the run-length limited code conversion is converted to the code sequence in which the maximum run k becomes finite, the modulation using the code having the restricted code can be performed.

According to the invention, since the code sequence replaced when the minimum run d is repeated more than the predetermined number of times Is converted to the predetermined code sequence, the demodulation of the code modulated using the code having the restricted code can be performed.

According to the invention, since the code sequence replaced from the run length code sequence when the maximum run k is infinite is converted to the predetermined code sequence, the demodulation of the code modulated using the code having the restricted code can be performed.

What is claimed is:

1. Modulating apparatus for converting data having a minimum run-length d (d≧1) and a basic data length of m bits, to a run-length limited code sequence (d, k; m, n; r) in which the minimum run-length of consecutive "0"s in a code sequence is "d", the maximum run-length of consecutive "0"s in a code sequence is "k", the data length per word is "m" bits, the basic code data word length to which the data is converted is "n" bits, and the maximum number of data words per code sequence is "r", comprising:

a run-length detection processing unit for detecting whether the minimum run-length d has been repeated at least a predetermined number of times in a selected portion of said run-length limited code sequence; and a converter for further converting a portion of said run-length limited code sequence in which the minimum run-length has been repeated at least the predetermined number of times to a substitute predetermined code sequence if said run-length detection processing unit detects that the minimum run-length has been repeated at least the predetermined number of times.

2. The modulating apparatus as claimed in claim 1, wherein the substitute predetermined code sequence is determined by referring to at least the selected portion of the run-length limited code sequence and preceding and/or subsequent portions of said run-length limited code sequence.

3. The modulating apparatus as claimed in claim 1, wherein the substitute predetermined code sequence is determined by referring to a portion of the run-length limited code sequence of at least 9 bits including the selected portion of the run-length limited code sequence when the minimum run-length d is equal to 1 and m=2, n=3.

4. The modulating apparatus as claimed in claim 1, wherein said converter removes said selected portion of the run-length limited code sequence from an output code sequence after the further conversion by said converter.

5. The modulating apparatus as claimed in claim 1, wherein said substitute predetermined code sequence has at least the minimum number d of consecutive "0"s and not more than the maximum number k of "0"s.

6. The modulating apparatus as claimed in claim 1, wherein said substitute predetermined code sequence may have more than the maximum number k of consecutive "0"s, but has at least the minimum number d of "0"s.

7. The modulating apparatus as claimed in claim 1, wherein the maximum number of data words per code sequence "r" is 1, and the code is a fixed length code.

8. The modulating apparatus as claimed in claim 1, wherein the maximum number r of data words per code sequence is $\geq 2$ and the run-length limited code sequence is a variable length code.

9. A converting method for converting data having a minimum run-length d ($d \geq 1$) and a basic data length of m bits, to a run-length limited code sequence (d, k; m, n; r) in which the minimum run-length of consecutive "0"s in a code sequence is "d", the maximum run-length of consecutive "0"s in a code sequence is "k", the data length per word is "m" bits, the basic code data word length to which the data is converted is "n" bits, and the maximum number of data words per code sequence is "r", comprising:

detecting whether the minimum run-length d has been repeated at least a predetermined number of times in a selected portion of said run-length limited code sequence; and further converting a portion of said run-length limited code sequence in which the minimum run-length d has been repeated at least the predetermined number of times, to a substitute predetermined code sequence when it has been detected that the minimum run-length d has been repeated at least the predetermined number of times.

10. A transmission medium for transmitting a computer program to convert data having a minimum run-length d ($d \geq 1$) and a basic data length of m bits, to a run-length limited code sequence (d, k; m, n; r) in which the minimum run-length of consecutive "0"s in a code sequence is "d", the maximum run-length of consecutive "0"s in a code sequence is "k", the data length per word is "m" bits, the basic code data word length to which the data is converted is "n" bits, and the maximum number of data words per code sequence is "r", in which the computer program carries out the steps of:

detecting whether the minimum run-length has been repeated at least a predetermined number of times in a selected portion of said run-length limited code sequence; and converting a portion of said run-length limited code sequence in which the minimum run-length has been repeated the predetermined number of times or more, to a substitute predetermined code sequence when it has been detected that the minimum run-length has been repeated the predetermined number of times.

11. Demodulating apparatus for converting a run-length limited code sequence (d, k; m, n; r), in which the minimum run-length of consecutive "0"s in the code sequence is "d", the maximum run-length of consecutive "0"s in the code sequence is "k", the data length per word is "m" bits, the basic code length to which the data is converted is "n" bits, and the maximum number of data words per code sequence is "r", the run-length limited code sequence having a minimum run-length d ($d \geq 1$) and a basic code length of n bits, to data in which the basic data length is m bits, comprising:

a detection unit for detecting a substitute predetermined code sequence representing a run-length limited code sequence in which the minimum run-length is repeated at least a predetermined number of times; and converting means for converting the substitute predetermined code sequence to the run-length limited code sequence in which the minimum run-length is repeated at least the predetermined number of times.

12. The demodulating apparatus as claimed in claim 11, wherein r is at least 1 and the run-length limited code sequence is a fixed length code.

13. The demodulating apparatus as claimed in claim 11, wherein r is at least 2 and the run-length limited code sequence is a variable length code.

14. A demodulating method for converting a run-length limited code sequence (d, k; m, n; r), in which the minimum run-length of consecutive "0"s in the code sequence is "d", the maximum run-length of consecutive "0"s in the code sequence is "k", the data length per word is "m" bits, the basic code length to which the data is converted is "n" bits, and the maximum number of data words per code sequence is "r", the run-length limited code sequence having a minimum run-length d ($d \geq 1$) and a basic code length of n bits, to data in which the basic data length is m bits, comprising the steps of:

detecting a substitute predetermined code sequence representing a run-length limited code sequence in which the minimum run-length is repeated at least a predetermined number of times; and converting the substitute predetermined code sequence to the run-length limited code sequence in which the minimum run-length is repeated at least the predetermined number of times.

15. A transmission medium for transmitting a computer program for converting a run-length limited code sequence (d, k; m, n; r), in which the minimum run-length of consecutive "0"s in a code sequence is "d", the maximum run-length of consecutive "0"s in a code sequence is "k", the data length per word is "m" bits, the basic code length to which the data is converted is "n" bits, and the maximum number of data words per code sequence is "r", the run-length limited code sequence having a minimum run-length d (d≧1) and a basic code length of n bits, to data in which the basic data length is m bits, in which the computer program carries out the steps of:

detecting a substitute predetermined code sequence representing a run-length limited code sequence in which the minimum run-length is repeated at least a predetermined number of times; and converting the substitute predetermined code sequence to the run-length limited code sequence in which the minimum run-length is repeated at least the predetermined number of times.

* * * * *